US012054585B2

(12) United States Patent
Chen et al.

(10) Patent No.: US 12,054,585 B2
(45) Date of Patent: Aug. 6, 2024

(54) LOW-K DIELECTRIC AEROGEL AND PREPARATION METHOD THEREFOR

(71) Applicant: Taiwan Aerogel Technology Material Co., Ltd., Tainan (TW)

(72) Inventors: Jean-Hong Chen, Tainan (TW); Shiu-Shiu Chen, Tainan (TW)

(73) Assignee: TAIWAN AEROGEL TECHNOLOGY MATERIAL CO., LTD., Tainan (TW)

( * ) Notice: Subject to any disclaimer, the term of this patent is extended or adjusted under 35 U.S.C. 154(b) by 503 days.

(21) Appl. No.: 17/488,666

(22) Filed: Sep. 29, 2021

(65) Prior Publication Data

US 2023/0098015 A1    Mar. 30, 2023

(51) Int. Cl.
  *C08G 73/10* (2006.01)
  *B01J 13/00* (2006.01)
  *C08G 85/00* (2006.01)
  *H01L 21/02* (2006.01)

(52) U.S. Cl.
  CPC .......... *C08G 73/10* (2013.01); *B01J 13/0091* (2013.01); *C08G 85/004* (2013.01); *H01L 21/02126* (2013.01); *H01L 21/02282* (2013.01); *C08G 2110/0091* (2021.01)

(58) Field of Classification Search
  None
  See application file for complete search history.

(56) References Cited

U.S. PATENT DOCUMENTS

2003/0001239 A1*  1/2003  Gallahger ......... H01L 21/02282
                                                        257/632

* cited by examiner

*Primary Examiner* — Hsien Ming Lee
(74) *Attorney, Agent, or Firm* — Locke Lord LLP; Tim Tingkang Xia, Esq.

(57) ABSTRACT

Manufacturing a low-K dielectric organic/inorganic aerogel composite material and its application are provided. The manufacturing method comprises: (1) mixing; (2) hydrolysis; (3) condensation; (4) aging; (5) drying; (6) impregnating polymer solution; (7) phase separation and drying; and (8) cross-linking and curing. The manufacturing method can produce a low-K dielectric organic/inorganic aerogel composite material having a high strength. The low-K dielectric aerogel is in a porous structure, and its porosity is higher than 70% and its density is from 0.12 g/cm³ to 0.45 g/cm³. The dielectric property of the low-K dielectric aerogel decreases along with an increase of its porosity, wherein a dielectric constant thereof is from 1.28 to 1.89, and a dielectric loss thereof is from 0.052 to 0.023. The low-k dielectric aerogel can be used for a dielectric layer in a high-frequency circuit, an insulation layer in a semiconductor device or a microwave circuit in a communication integrated circuit.

14 Claims, 5 Drawing Sheets

LOW-K DIELECTRIC AEROGEL AND PREPARATION METHOD THEREFOR

FIELD OF THE INVENTION

The present invention relates to a preparation technique for directly preparing an inorganic aerogel and impregnating an inorganic aerogel into a dilute polymer solution to form a low-k organic/inorganic aerogel composite material, and such low-k dielectric organic/inorganic aerogel composite material is a porous structure.

BACKGROUND OF THE INVENTION

Presently, it is known that the dielectric property of known materials tends to gradually decrease along with the increase of internal porosity of materials; accordingly, aerogel material and its relevant composite materials are expected to become important low-k dielectric related products necessary for the development of the future 5G industry. In addition, it is also known that aerogel is a porous material with a three-dimensional network structure, and its porosity may be higher than 80% (or even higher than 95%), making aerogel material to be a technology product having the properties of low density (approximately 0.005 to 0.2 g/cm$^3$), high specific surface area (500 to 2000 m$^2$/g), low thermal conductivity (k=15 to 40 mW/mk) and low dielectric property (Dk=0.1 to 2.5) and low dielectric loss (Df<0.001 and less). Since aerogel is a material of high porosity and extremely low density, it can be used for applications of high thermal insulation, cold insulation, sound insulation or low-k dielectric material. For the future 5G high-frequency transmission application, it is necessary to use a dielectric material with low dielectric constant (Dk<2.5) and low signal loss (Df<0.005). Due to the porosity, electron/hole transport property is relatively lower; therefore, for both organic and inorganic materials, as the porosity of the structure is higher, the dielectric property is lower. Accordingly, for future 5G high-frequency application, porous materials will be used as the main functional materials. Japanese Patent Publication No. 8-228105 discloses a method for manufacturing a semiconductor device. In such method, a wet gel film is formed on a substrate, and a solvent impregnated with the wet gel film undergoes the supercritical and subcritical drying process and evaporation to form an aerogel film. The dry aerogel film prepared is able to still maintain the network structure of the web gel film, and it is a porous material with high porosity and low dielectric constant. Accordingly, such aerogel can be used as a new material for the dielectric layer and the insulating inner layer. Nevertheless, the use of the supercritical or subcritical drying process in the transistor structure manufacturing process can cause the shortcomings of complicated process and expensive equipment investment. The "supercritical drying" means that water and organic solvent are at the supercritical state under the condition of high temperature and high pressure, in order to allow the organic solvent and water to be equipped with the gas-liquid mixed properties simultaneously, such that the solvent can be vaporized directly under the supercritical state to achieve the drying. Accordingly, the removal of the remaining solvent from the network structure under such supercritical condition, the wet gel does not contract. However, during the preparation process of transistor structure, the time periods from the solution preparation to the coating for the low-k dielectric film are not consistent. Furthermore, during the aerogel solution condensation process, aggregation and coagulation occur among the silica gel molecules immediately; therefore, the viscosity of the aerogel solution increases along with the increase of the time. When rotational coating is performed at a fixed rate, the coating film on the substrate also increases. Similarly, the coating thickness of the transistor film structure tend to have different thicknesses as the process time increases. As a result, it is not possible to prepare a high-quality transistor film structure.

A traditional preparation method for an aerogel is the sol-gel process. It mainly uses a precursor of alkoxysilane, methyl silicate or sodium silicate to mix with an organic solvent, followed by adding an acid catalyst to perform the hydrolysis reaction. After a certain period of the hydrolysis reaction, a basic catalyst is then added in order to perform the condensation reaction. During the condensation reaction, sol is gradually formed, and the molecules in the sol continue to undergo the reactive bonding in order to gradually form a semisolid polymeric gel. Furthermore, after a certain period of aging, the gel is able to form a stable three-dimensional network structure. Finally, the solvent of n-butanol, n-hexanol, n-hexane or cyclohexane is further used to perform solvent substitution, following which the supercritical drying technique is used to extract and dry the solvent of the aerogel system.

The preparation for a hydrophobic aerogel is a sol-gel process. It mainly uses the methyl silane type of precursors, such as methyltrimethoxysilane (MTMS) or methyltriethoxysilane (MTES), to perform mixing with an organic solvent, followed by adding a basic catalyst, in order to perform the hydrolysis reaction. After a certain period of the hydrolysis reaction, condensation reaction is then performed. During the condensation reaction, sol is gradually formed, and the molecules in the sol continue to undergo the reactive bonding in order to gradually form a semisolid polymeric gel. Furthermore, after a certain period of aging, a solvent of isopropanol, acetone, n-hexane or cyclohexane is used to perform the solvent substitution for a period of two to three days in order to allow the hydrophobic gel to form a stable three-dimensional network structure. Finally, the constant pressure drying technique is used to dry the solvent of the aerogel system in order to obtain a porous and dry aerogel monolith.

Since the drying technique used in the aforementioned aerogel preparation method adopts the supercritical drying technique or multiple solvent substitutions for a period of two to three days, it is able to prevent cracks in the aerogel due to the impact of the surface tension of the water during the drying process under constant pressure. However, as the supercritical drying technique needs to be performed under a high-pressure condition, such technique is only suitable to aerogel of extremely small amount. In addition, the multiple times of solvent substitutions involved is also time consuming, which is not optimal for mass production to reduce the production cost of aerogel.

U.S. Pat. No. 8,945,677B2 "Electronic Device Manufacture Using Low-K Dielectric Materials" mainly discloses materials and methods for manufacturing electronic devices and semiconductor components using low dielectric materials (including polyimide-based aerogels). According to the patent disclosure of this prior art, it further discloses methods for manipulating the characteristics of dielectric materials and affecting the system overall dielectric property. To be more specific, polyamic acid pre-sol, a catalyst and a polar, aprotic solvent are mixed to form a sol composition layer. Next, the sol composition is cross-linked to form a wet-gel material. In addition, a supercritical fluid is used to remove the solvent in order to form a polyimide aerogel film. Such technique is applied to a non-porous and low-k substance in order to combine it with the polyimide aerogel. In this prior art, it uses low-k dielectric materials to manufacture electronic devices and also utilizes the pressure cycle method to perform the removal of solvent via multiple sessions of the supercritical fluid technique. However, the overall technique is time consuming and requires high cost. The time necessary for the process is too long, and the method is not cost effective.

Chinese Invention Patent Publication No. CN102044525A "Low-K Dielectric Layer Structure, Semiconductor Component Structure and Formation Method Thereof" mainly discloses the use of a silica aerogel to form a low-k dielectric layer structure. This patent prior art also provides a semiconductor component structure and formation method thereof, and the formation method comprises: providing a substrate, forming a first dielectric layer and an etch mask layer on the substrate, the first dielectric layer and the etch mask layer having an opening formed thereon, the opening filled with a metal therein as a plug; forming a sacrificial oxide layer on the etch mask layer and the plug; forming an opening on the sacrificial oxide layer; filling a metal inside the opening to form an interconnection structure; wherein such interconnection structure is electrically connected to the plug; selectively removing the sacrificial oxide layer to form voids in the interconnection structure; forming a silica aerogel inside the voids of the interconnection structure as a low-k dielectric layer. In this patent prior art, a low-k dielectric layer structure is used, and tetraethyl orthosilicate (TEOS) or tetramethyl orthosilicate (TMOS) is used for the material structure. In addition, its drying process uses the constant temperature or supercritical fluid technique in multiple sessions to prepare the low dielectric film. However, the overall technique is time consuming and requires high cost. The time necessary for the process is too long, and the method is not cost effective.

Chinese Invention Patent Publication No. CN105189104A "Aerogel Insulated Panel and Manufacturing Thereof" mainly discloses the use of polyimide aerogel to manufacture an insulated panel, and it can be used for a laminated panel in the aviation and aerospace application. Such panel comprise a polyimide aerogel surface layer and a reflective protection layer on the surface layer. In this patent prior art, the manufacturing process of the polyimide aerogel comprises: (a) polymerizing a mixture of anhydride and diamine monomer in a bipolar basic solution (DMAc or NMP) to form a polyimide solution: (b) casting the polyimide solution into a fiber lint; (c) using acetic anhydride and pyridine to gelatinize the polyimide solution via a chemical imidization reaction; (d) using a supercritical or subcritical $CO_2$ drying technique to remove the solvent in the gel in order to form a fiber/polyimide aerogel composite material.

U.S. Pat. No. 9,777,126B2 "Aerogel/Polymer Composite Materials" discloses new composite materials containing aerogels blended with thermoplastic polymer materials at a weight ratio of aerogel to thermoplastic polymer of less than 20:100. The composite materials have improved insulation ability and also have better flexibility and less brittleness at low temperatures than the parent thermoplastic polymer materials.

Chinese Invention Patent Publication No. CN108203516A "Method for Preparing Cross-link Polyimide Aerogel" mainly discloses the use of a sol-gel method, comprising: (a) polymerizing a mixture of anhydride and diamine monomer in a bipolar basic solution (DMAc or NMP) to form a polyimide solution: (b) casting the polyimide solution into a fiber lint; (c) using acetic anhydride and pyridine to gelatinize the polyimide solution via a chemical imidization reaction; (d) using a supercritical or subcritical $CO_2$ drying technique to remove the solvent in the gel in order to form a fiber/polyimide aerogel composite material.

During the manufacturing of a nano-porous dielectric material, it is preferably to perform the known aging process on the wet gel film. At the gel point, the hydrolysis and condensation reactions are not stopped, but the gel structure continues to be changed (or aged) until the reaction is intentionally terminated. During the period of aging, the part of solid structure dissolves first and then deposits, such that it is able to achieve advantageous results, such as: higher strength, pores with greater uniformity and greater resistance to the contraction of micropores during the drying period.

SUMMARY OF THE INVENTION

In the aerogel monolith production technique previously developed by the present applicant, fast condensation technique is used to allow the contraction rate of the preparation of the aerogel monolith to be reduced to below 7%, and it is not required to immerse the aerogel wet gel into the solvent in order to perform the solvent substitution; therefore, preparation of crystal structure can be performed swiftly. The technique of this prior art is to utilize the fast gelatinization technique to allow the gel structure to be formed swiftly, and the deionized water is used to perform washing in order to remove ions in the structure, thereby reducing the ion accumulation during the subsequent application process. In addition, for the entire process, the step of removing the wet gel film during the liquid immersion and the step of using supercritical fluid technique to remove solvent are performed, such that remarkably, a porous low dielectric film can be obtained through aging in a short period of approximately few minutes.

Accordingly, to improve relevant drawbacks associated with the application of known low dielectric aerogel manufacturing and low dielectric polymer aerogel manufacturing in optoelectronics or electronic components, such as the drawbacks of non-uniformity of low dielectric aerogel structure, little improvement in aerogel dielectric property or reduction of dielectric loss and the issue of difficulty in the application of supercritical drying technique to integrated circuit structure preparation etc., the present invention provides a manufacturing method integrating the sol-gel technique to prepare a low-k dielectric inorganic aerogel or a low-k dielectric organic/inorganic aerogel composite board or a low-k dielectric inorganic aerogel film having a thickness between several tenths of millimeters to several hundreds of millimeters, and such method comprises the following steps: (1) mixing step: mixing an alkoxysilane compound or a hydrophobically modified alkoxysilane compound with an organic mixed solvent to form a mixed solution; (2) hydrolysis step: adding an acid catalyst into the mixed solution in order to perform a hydrolysis reaction; (3) condensation step: adding a basic catalyst into the mixed solution after the hydrolysis reaction in order to perform a condensation reaction, and also adding a small amount of a surfactant during the condensation reaction process in order to decrease the interfacial tension of aerogel and to prevent cracks in the aerogel structure during the aerogel drying process; (4) aging step: performing aging of an aerogel board formed under a specific temperature in order to promote an aerogel structure to condense further and to achieve a stable structure; and (5) drying step: after gelatinization and stabilization of the aerogel board structure, performing high temperature drying under an environment of constant pressure and high temperature in order to obtain a low-k dielectric silicon-based aerogel board having a uniform structure, a high porosity and a high specific surface area, and in particular, a silicon-based aerogel board material can be obtained. In addition, the manufacturing technique for preparing a low-k dielectric organic/inorganic aerogel composite board further comprises the following steps: (6) impregnating polymer solution step: impregnating the low-k dielectric silicon-based aerogel board prepared into a dilute polymer solution in order to allow polymer chains to infiltrate into an internal of the silicon-based aerogel board uniformly, thereby forming a wet polymer/silicon-based composite material; (7) phase separation and drying step: placing the wet polymer/silicon-based composite material under a specific temperature in order to allow a solvent in the dilute polymer solution to vaporize, thereby performing a liquid-solid phase separation on polymers inside the wet polymer/silicon-based composite material to further allow the polymer chains to cover onto a network skeleton structure of the low-k dielectric silicon-based aerogel and to be dried gradually; and (8) cross-linking and curing step: placing the polymer/silicon-based composite material after drying under a specific high temperature environment in order to allow the polymer chains of the network skeleton structure of the low-k dielectric silicon-based aerogel to perform a cross-linking reaction, and chemical reaction bonding occurred between the polymer chains and between the polymer chains and silicon-based aerogel molecules during the high-temperature cross-linking reaction, thereby obtaining a porous, lightweight and low-k dielectric organic/inorganic aerogel composite board material after the cross-linking reaction. The method of the present invention is able to manufacture low-k dielectric inorganic aerogel or organic/inorganic aerogel composite boards swiftly, the overall process is simple, and different sizes of aerogel films having thicknesses from several tens of millimeters to several hundreds of millimeters and aerogel boards having thicknesses from several millimeters to several centimeters can be prepared. The overall manufacturing process speed is fast and can be shortened to a period between 12 to 36 hours for completion. Accordingly, the production efficiency for the preparation of low-k dielectric inorganic aerogel or organic/inorganic aerogel composite boards can be increased.

Furthermore, the alkoxysilane compound is selected from one or a plurality of groups consisting of the following substances: tetramethoxysilane (TMOS) and tetraethoxysilane (TEOS). The hydrophobically modified alkoxysilane compound is selected from one or a plurality of groups consisting of the following substances: methyltrimethoxysilane (MTMS) and methyltriethoxysilane (MTES). The main purpose of adding the hydrophobically modified alkoxysilane compound is to reduce the cracking phenomena occurred in the aerogel system during the drying process. In addition, the purpose of adding the alkoxysilane is to adjust the microstructure inside the aerogel system and to increase the porosity in the structure.

Furthermore, the organic mixed solvent is selected from one or a plurality of groups consisting of the following substances: water, pure water, deionized water, alcohols, acids, ketones, alkanes, and aromatic compounds.

Furthermore, in the hydrolysis step, when the content ratio of the acid catalyst in the mixed solution is higher, the hydrolysis rate is faster. On the contrary, when the content ratio of the acid catalyst is higher, the ion content in the overall aerogel structure is greater, and the dielectric loss of the aerogel is higher; therefore, during the preparation process, deionized water can be used for the aerogel preparation in order to reduce the dielectric property in the aerogel structure.

Furthermore, the purpose of adding a small amount of surfactant in the condensation reaction process is to decrease the interfacial tension of the aerogel structure after condensation and to reduce formation of cracks caused by the interfacial tension during the drying process of the aerogel.

Furthermore, the drying step is able to allow the inorganic aerogel aged and stabilized to perform the evaporation of aqueous solvent in the system under an environment of constant pressure and high temperature. In addition, with the addition of small amount of surfactant in the present invention, the formation of crack in the inorganic aerogel is clearly suppressed during the drying process, such that a low-k dielectric inorganic aerogel board having a low density and high porosity can be prepared and manufactured, and in particular, a low-k dielectric silicon-based aerogel board can be prepared and manufactured.

Furthermore, in the present technique, it is also able to prepare a low-k dielectric organic/inorganic aerogel composite board, and the step of impregnating the low-k dielectric silicon-based aerogel board prepared into a polymer solution is particularly utilized in order to allow the polymer chains to uniformly infiltrate into the pores inside the silicon-based aerogel board with the solvent in order to form a wet polymer impregnated silicon-based aerogel composite material. In addition, when the concentration of the polymers is lower, the efficiency of the polymers infiltrating into the pores inside the silicon-based aerogel is higher. On the other hand, when the concentration of the polymer is higher, the content of the polymers covering the internal of the silicon-based aerogel is also higher, and the strength of the low-k dielectric organic silicon-based aerogel composite board is greater.

Furthermore, in the phase separation and drying step, the dilute polymer solution inside the wet polymer impregnated silicon-based aerogel composite material undergoes the phase separation first, thereby promoting the polymer molecular chains to cover onto the aerogel skeleton structure inside the silicon-based aerogel of high porosity. At the same time, the organic solvent inside the silicon-based aerogel of high porosity is also vaporized, such that the wet polymer impregnated silicon-based aerogel composite material can be gradually dried.

Furthermore, during the preparation process of the present invention, the low-k dielectric aerogel structure is prepared first, followed by using the low-k dielectric aerogel prepared to contact with the dilute polymer solution via the method of impregnation, spray coating, flow coating or soaking, in order to allow the polymer chains to uniformly infiltrate into the pores inside the low-k dielectric aerogel board and to mix with the inorganic aerogel structure with each other, thereby forming a wet polymer impregnated silicon-based aerogel composite material. Next, the drying process under constant pressure and high temperature and high temperature cross-linking process are performed in order to obtain a low-k dielectric inorganic/organic aerogel composite material of high strength and high porosity, and in particular, a low-k dielectric polymer/silicon-based aerogel composite material can be obtained. In general, the method of the present invention has the merits of simple process, low manufacturing cost, fast production speed and requiring no complicated process techniques of, such as, supercritical drying. The organic/inorganic aerogel composite board batch production speed described can be fast and the time required for completion can be reduced to a period between 24 hours and 36 hours, or the organic/inorganic aerogel film can also be prepared and manufactured via a continuous production method, thereby increasing the production efficiency.

The present invention has at least the following technical effects:

1. The preparation method of the present invention is able to utilize the traditional sol-gel reaction process to an inorganic aerogel material of high porosity and low dielectric constant through simple steps. In addition, during the process, with the control of the factors of different ratios of alkoxysilane compound and ratios of hydrophobically modified alkoxysilane compound, content of the aqueous organic solvent, acid catalyst and basic catalyst content and ratio etc., the porosity of the aerogel structure, pore size and aerogel structure compactness can be easily adjusted and controlled, thereby further adjusting and controlling the dielectric property of the aerogel prepared in order to increase the practicability of the aerogel.

2. The preparation method of the present invention is able to prepare a purely inorganic aerogel material, and it can also further utilize various types of dilute polymer solutions for impregnation in order to prepare an organic/inorganic aerogel composite material of high strength, high porosity and low dielectric constant, and in particular, to a low-k dielectric polymer/silicon-based aerogel composite material.

3. The impregnating polymer solution step in the preparation method of the present invention is to impregnate a silicon-based aerogel board into a dilute polymer solution in order to allow relevant polymer chains to uniformly infiltrate into the pores inside the silicon-based aerogel board with the solvent, thereby forming a wet polymer impregnated silicon-based aerogel composite material. For such process, when the concentration of the polymers is lower, the efficiency of the polymers infiltrating into the pores inside the silicon-based aerogel is higher. On the other hand, when the concentration of the polymers is higher, the content of the polymers covering the internal of the silicon-based aerogel is higher, and the strength of the low-k dielectric organic/silicon-based aerogel composite board is greater. Accordingly, the dielectric constant and strength of the low-k dielectric organic/silicon-based aerogel composite board prepared can be adjusted and controlled via the use of the concentration of the dilute polymer solution.

4. The dilute polymer solution described in the preparation method of the present invention can be formed by one or a combination of the mixture of the following polymers: a thermoset polymer, a liquid crystal polymer and a thermal plastic polymer; to be more specific, such as: epoxy, polyimide, phenolic resin, melamine resin, PEK, PEEK, polypropylene (PP), polyethylene (PE), polycarbonate (PC), polyamide (PA), polyesteramide (PEA), polyethylene terephthalate (PET) or polytetrafluoroethylene (PTFE). In this process, various types of polymer solutions can be mixed to prepare all kinds of low-k dielectric polymer/silicon-based aerogel composite material of different properties in order to adjust and control the properties of, strength, durable temperature, bonding capability with other materials and product dielectric constant (approximately between 1.23 and 1.89) and dielectric loss (between 0.0052 and 0.023) of the low-k dielectric polymer/silicon-based aerogel composite material.

5. The acid catalyst and basic catalyst added in the preparation method of the present invention are able to accelerate the hydrolysis and condensation reactions of the alkoxysilane and hydrophobically modified alkoxysilane. In addition, for the acid catalyst used in the reaction system, the mole ratio between the total content of the alkoxysilane and hydrophobically modified alkoxysilane compounds and the content of the acid catalyst is between 1:0.05 and 1:0.00001. In the condensation reaction, the mole ratio between the acid catalyst and the basic catalyst is between 1:0.8 and 1:1.05. When contents of the acid catalyst and basic catalyst in the mixed solution are higher, the reaction rate is faster. On the other hand, when the contents of the acid catalyst and basic catalyst are higher, the ion content in the overall aerogel structure is higher; therefore, the dielectric loss of the aerogel becomes greater. Accordingly, such factor can be used to adjust and control the process speed and product nature.

6. The overall process of the low-k dielectric polymer/silicon-based aerogel composite material of the present invention has the merits of simple process steps, low manufacturing cost, fast process speed and not requiring the use of complicated process techniques of, such as, supercritical drying. In addition, such organic/inorganic aerogel composite board batch process speed can be fast and the time required for completion can be reduced to a period between 24 hours and 36 hours, or a continuous production method can be adopted for the preparation, thereby increasing the production efficiency.

DETAILED DESCRIPTION OF THE INVENTION

Figure 1:
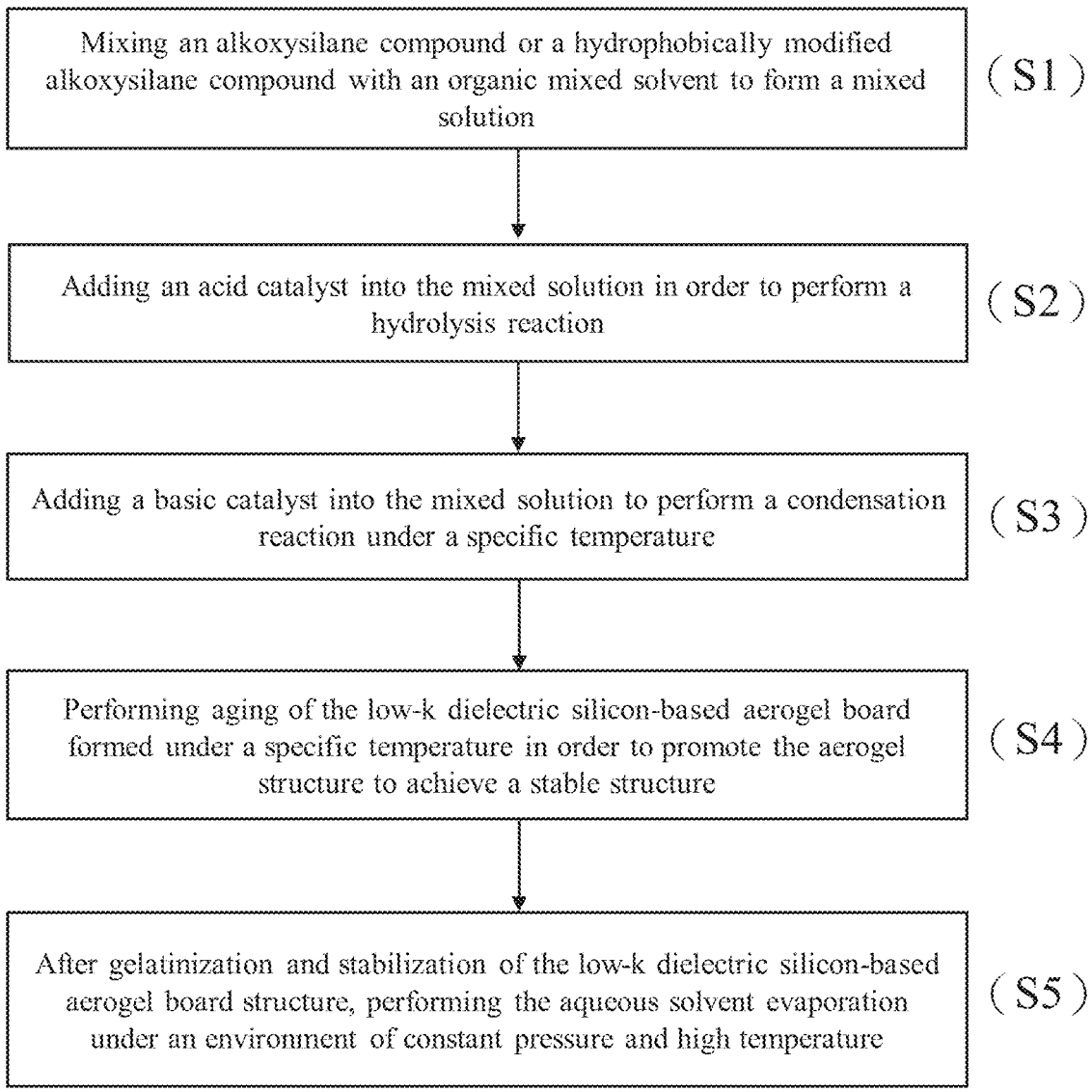
FIG. 1 is a flow chart illustrating the low-k dielectric aerogel process steps according to an embodiment of the present invention.

Please refer to FIG. 1, showing a preparation method for a low-k dielectric silicon-based aerogel board, comprising the following steps: mixing step (S1), hydrolysis step (S2), condensation step (S3), aging step (S4) and drying step (S5). Each step is further described in detail as follows.

In the mixing step (S1): mixing an alkoxysilane compound or a hydrophobically modified alkoxysilane compound with an organic mixed solvent to form a mixed solution. In addition, the alkoxysilane compound is selected from one or a plurality of groups consisting of the following substances: tetramethoxysilane (TMOS) and tetraethoxysilane (TEOS). The hydrophobically modified alkoxysilane compound is selected from one or a plurality of groups consisting of the following substances: methyltrimethoxysilane (MTMS) and methyltriethoxysilane (MTES). The purpose of adding the hydrophobically modified alkoxysilane compound is to reduce the cracking phenomena occurred in the aerogel system during the drying process. In addition, the purpose of adding the alkoxysilane is to adjust the microstructure inside the aerogel system and to increase the porosity in the structure. In the entire mixed solution, the mole ratio between the total contents of alkoxysilane and hydrophobically modified alkoxysilane is between 3.0 mol % and 60 mol %, and the mole ratio for the content of the organic solvent is between 97 mol % and 40 mol %. Furthermore, the mole ratio between alkoxysilane and hydrophobically modified alkoxysilane is between 0:100 and 35:65; preferably, the mole ratio is 22:78.

The organic mixed solvent in the mixing step (S1) can be water, treated water, deionized water, C1~C16 alcohols, C3~C16 ketones, C3~C16 alkanes, or C3~C16 aromatic compounds; to be more specific, it can be one or a mixture of different combinations of, such as, water, treated water, deionized water, ethanol, acetone, cyclohexane, and methylbenzene.

In the hydrolysis step (S2): adding an acid catalyst into the mixed solution in order to perform a hydrolysis reaction. In addition, the mole ratio between the total content of the mixture of alkoxysilane and hydrophobically modified alkoxysilane and the content of acid catalyst is between 1:0.05 and 1:0.00001. When the content ratio of the acid catalyst in the mixture of alkoxysilane and hydrophobically modified alkoxysilane is higher, the hydrolysis rate is faster; i.e., when the content of the acid catalyst is higher, the ion content in the overall aerogel structure is greater, and the dielectric loss of the aerogel is also greater. In this embodiment, the preferred criterion is that the mole ratio between the total content of the mixture of alkoxysilane and hydrophobically modified alkoxysilane and the content of the acid catalyst is 1:0.0075. In the condensation step (S3): adding a basic catalyst into the mixed solution to perform a condensation reaction under a specific temperature. In addition, during the condensation reaction process, a small amount of a surfactant is also added. The weight ratio between the amount of the surfactant added in small amount and the amount of the mixture of alkoxysilane and hydrophobically modified alkoxysilane is between 1:100 and 1:3000; and the preferred criterion in this embodiment refers to that the content weight ratio is 1:1000. The purpose of adding a small amount of a surfactant is to decrease the interfacial tension of the aerogel structure after condensation and to reduce the cracking phenomena of the aerogel during the drying process thereof. The basic catalyst is mixed with the water and ethanol solution, followed by adding such mixture in to perform the condensation reaction. The mole ratio between the water and ethanol is between, such as, 100:0.1 and 4:1, and in this embodiment, the preferred criterion is, such as, 50:1.

An increase of the temperature during the condensation step can be helpful in reducing the condensation reaction time (i.e., the gelatinization time for the aerogel) significantly. When the content weight ratio between the basic catalyst and the acid catalyst is 1.0:1.0, the gelatinization time under the condensation reaction temperature of the room temperature of 25° C. is 220 minutes; whereas the gelatinization time under the condensation reaction temperature of 70° C. is approximately 10 minutes. In addition, in the mixed solution of the basic catalyst with the water and ethanol, an increase of the basic catalyst content can also significantly reduce the condensation reaction time. When the content volume ratio between 1M of basic catalyst and 1M of acid catalyst is 0.8:1.0, the gelatinization time is approximately 360 minutes; whereas when the content ratio between 1M of basic catalyst and 1M of acid catalyst is 1.2:1.0, the gelatinization time is reduced to approximately 15 minutes.

In the aging step (S4): performing aging of the low-k dielectric silicon-based aerogel board formed under a specific temperature in order to promote the aerogel structure to achieve a stable structure. In this embodiment, the preferred aging temperature is 70° C.

Figure 2:
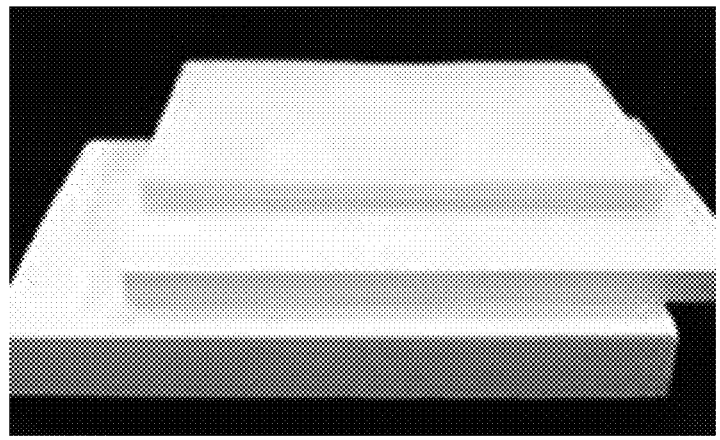
FIG. 2 is a photo image showing the appearance of a low-k dielectric silicon-based aerogel board prepared according to the present invention.
Figure 3:
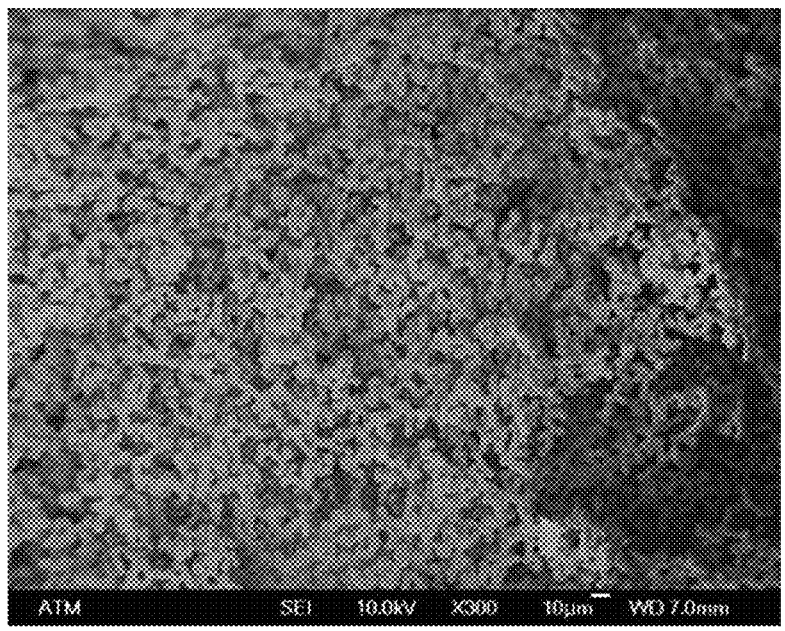
FIG. 3 is a photo image taken from a scanning electron microscope showing a cross section of a low-k dielectric silicon-based aerogel board prepared according to the method of the present invention.

In the drying step (S5): after gelatinization and stabilization of the low-k dielectric silicon-based aerogel board structure, performing the aqueous solvent evaporation under an environment of constant pressure and high temperature. Since the material contains the surfactant, the bonding force of the surfactant can be utilized for the drying process to rapidly reduce the cracking formation occurred during the drying of the aerogel, thereby preparing and achieving a low-k silicon-based aerogel board of low density and high porosity. Please refer to FIG. 2 and FIG. 3, illustrating the appearance and internal microstructure of a low-k dielectric silicon-based aerogel board prepared by using the method of the present invention. FIG. 3 shows a three-dimension network structure formed by the bonding of aerogel particles with uniform appearance structure in a low-k dielectric silicon-based aerogel board prepared, and the size of the aerogel particles are between micrometers to sub-micrometers. Furthermore, the particle size be adjusted and controlled via the use of the ratio between the acid catalyst and basic catalyst.

Figure 4:
FIG. 4 is a flow chart illustrating the low-k dielectric organic/silicon-based aerogel composite board process steps according to an embodiment of the present invention.

Please refer to FIG. 4, showing a preparation method for a low-k dielectric organic/silicon-based aerogel composite board according to a second embodiment of the present invention, and the method comprises the following steps: mixing step (S1), hydrolysis step (S2), condensation step (S3), aging step (S4) and drying step (S5), impregnating polymer solution step (S6), phase separation and drying step (S7) and cross-linking and curing step (S8). Each step is further described in detail as follows.

In the mixing step (S1): mixing an alkoxysilane compound or a hydrophobically modified alkoxysilane compound with an organic mixed solvent to form a mixed solution. In addition, the alkoxysilane compound is selected from one or a plurality of groups consisting of the following substances: tetramethoxysilane (TMOS) and tetraethoxysilane (TEOS). The hydrophobically modified alkoxysilane compound is selected from one or a plurality of groups consisting of the following substances: methyltrimethoxysilane (MTMS) and methyltriethoxysilane (MTES). The purpose of adding the hydrophobically modified alkoxysilane compound is to reduce the cracking phenomena occurred in the aerogel system during the drying process. In addition, the purpose of adding the alkoxysilane is to adjust the microstructure inside the aerogel system and to increase the porosity in the structure. In the entire mixed solution, the mole ratio between the total contents of alkoxysilane and hydrophobically modified alkoxysilane is between 3.0 mol % and 60 mol %, and the mole ratio for the content of the organic solvent is between 97 mol % and 40 mol %. Furthermore, the mole ratio between alkoxysilane and hydrophobically modified alkoxysilane is between 0:100 and 35:65; preferably, such mole ratio is 5:95.

The organic mixed solvent in the mixing step (S1) can be water, treated water, deionized water, C1~C16 alcohols and C3~C16 ketones, C3~C16 alkanes, or C3~C16 aromatic compounds; to be more specific, it can be one or a mixture of different combinations of, such as, water, treated water, deionized water, ethanol, acetone, cyclohexane, and methylbenzene.

In the hydrolysis step (S2): adding an acid catalyst into the mixed solution in order to perform a hydrolysis reaction. In addition, the mole ratio between the total content of the mixture of alkoxysilane and hydrophobically modified alkoxysilane and the content of acid catalyst is between 1:0.05 and 1:0.00001. When the content ratio of the acid catalyst in the mixture of alkoxysilane and hydrophobically modified alkoxysilane is higher, the hydrolysis rate is faster; i.e., when the content of the acid catalyst is higher, the ion content in the overall aerogel structure is greater, and the dielectric loss of the aerogel is also greater. In this embodiment, the preferred criterion is that the mole ratio between the total content of the mixture of alkoxysilane and hydrophobically modified alkoxysilane and the content of the acid catalyst is 1:0.0075.

In the condensation step (S3): adding a basic catalyst into the mixed solution to perform a condensation reaction under a specific temperature. In addition, during the condensation reaction process, a small amount of a surfactant is also added to decrease the interfacial tension of the aerogel structure after condensation and to reduce the cracking formation in the aerogel during the drying process thereof. In the mixed solution containing the acid catalyst, basic catalyst, and surfactant, the content of the surfactant is 0.01 mol % to 0.5 mol %, wherein the preferred contents is 0.2 mol %. In addition, the weight ratio between the content of the surfactant added in small amount and the total content of the mixture of alkoxysilane and hydrophobically modified alkoxysilane is between 1:100 and 1:3000; and in this embodiment, the preferred criterion for the content weight ratio is 1:1000. Furthermore, the basic catalyst is mixed with the water and ethanol solution, followed by adding such mixture in to perform the condensation reaction. The mole ratio between the water and ethanol is between, such as, 100:0.1 and 4:1, and in this embodiment, the preferred criterion is, such as, 50:1.

An increase of the temperature during the condensation step can be helpful in reducing the condensation reaction time (i.e., the gelatinization time for the aerogel) significantly. When the content weight ratio between the basic catalyst and the acid catalyst is 1.0:1.0, the gelatinization time under the condensation reaction temperature of the room temperature of 25° C. is 220 minutes; whereas the gelatinization time under the condensation reaction temperature of 70° C. is approximately 10 minutes. In addition, in the mixed solution of the basic catalyst with the water and ethanol, an increase of the basic catalyst content can also significantly reduce the condensation reaction time. When the content volume ratio between 1M of basic catalyst and 1M of acid catalyst is 0.8:1.0, the gelatinization time is approximately 360 minutes; whereas when the content ratio between 1M of basic catalyst and 1M of acid catalyst is 1.2:1.0, the gelatinization time is reduced to approximately 15 minutes. In addition, the preferred content ration between the 1M basic catalyst and 1M acid catalyst is 1.05:1.0.

In the aging step (S4): performing aging of the silicon-based aerogel board formed under a specific temperature in order to promote the aerogel wet gel structure to achieve a stable structure. In this embodiment, the preferred aging temperature used is 70° C.

In the drying step (S5): after aging and stabilization of the silicon-based aerogel board structure, performing the aqueous solvent evaporation under an environment of constant pressure and high temperature. Since the material contains the surfactant, the bonding force of the surfactant can be utilized for the drying process to rapidly reduce the cracking formation occurred during the drying of the aerogel, thereby preparing and achieving a low-k silicon-based aerogel board of low density and high porosity.

In the impregnating polymer solution step (S6): after the silicon-based aerogel board structure forms a silicon-based aerogel board having a complete structure and an appropriate strength after the drying process, impregnating the silicon-based aerogel board into a dilute polymer solution in order to allow the polymer chains to infiltrate into an internal holes of the silicon-based aerogel board uniformly with the solvent, thereby forming a wet polymer impregnated silicon-based composite material. In this embodiment, the concentration of the dilute polymer solution can be between 0.01 wt % and 60 wt %, and it is preferably to be between 0.05 wt % and 60 wt %. As the concentration of the polymers is lower, the efficiency of the polymers infiltrating into the pores inside the silicon-based aerogel is higher. On the contrary, as the concentration of the polymers is higher, the content of the polymers covering the internal of the silicon-based aerogel is higher, and the strength of the low-k dielectric organic/silicon-based aerogel composite board is greater. In other words, the dielectric constant and the strength of the low-k dielectric organic/silicon-based aerogel composite board prepared can be adjusted and controlled via the use of the concentration of the dilute polymer solution. Furthermore, the preferred concentration of the dilute polymer solution is between 3.0 wt % and 8.5 wt %.

In the phase separation and drying step (S7): after the impregnation of the wet polymer impregnated silicon-based aerogel composite material is complete, performing the evaporation of the solvent in the wet polymer impregnated silicon-based aerogel composite material under an environment of constant pressure and high temperature. During the drying process, the dilute polymer solution in the wet polymer impregnated silicon-based aerogel composite undergoes the liquid-solid phase separation first, causing the polymer molecular chains to cover onto the aerogel skeleton structure inside the silicon-based aerogel of high porosity. At the same time, the organic solvent inside the silicon-based aerogel of high porosity is also vaporized, allowing to the wet polymer impregnated silicon-based aerogel composite material to be dried gradually. The drying temperature used in such process can be determined depending upon the boiling point of the organic solvent. For example, when the solvent is ethanol, then the drying temperature is between 60 and 65° C.; when the solvent is butanone, then the drying temperature is between 80 and 85° C. Accordingly, a dry polymer impregnated silicon-based aerogel composite material can be prepared and achieved.

Figure 5:
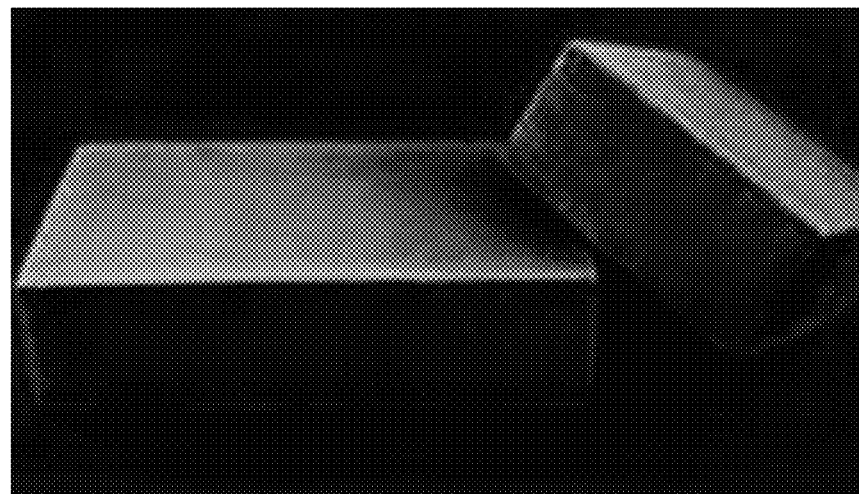
FIG. 5 is a photo image showing the appearance of a low-k dielectric polyimide/silicon-based aerogel composite board prepared according to the method of the present invention.
Figure 6:
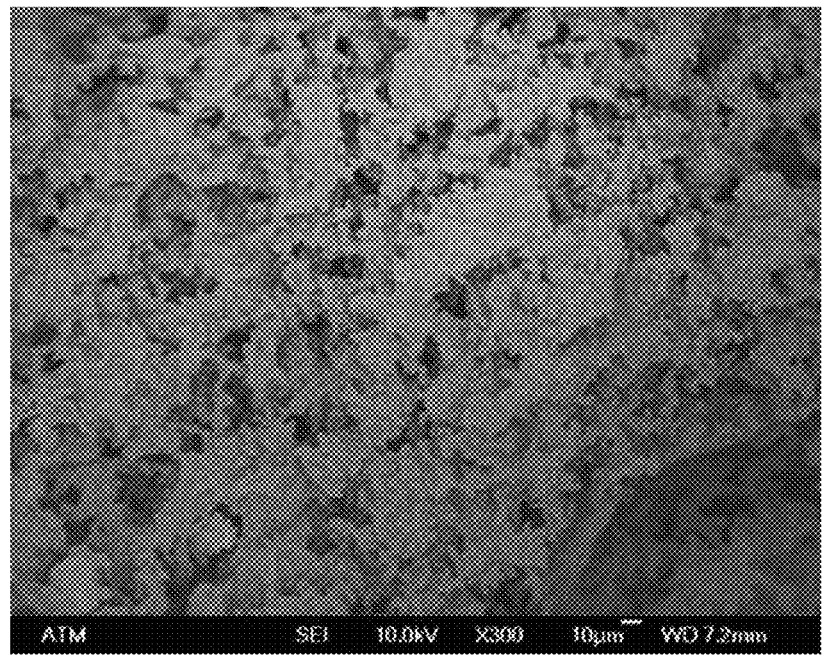
FIG. 6 is a photo image taken from a scanning electron microscope showing a low-k dielectric polyimide/silicon-based aerogel composite board prepared according to the method of the present invention.

In the cross-linking and curing step (S8): placing the polymer impregnated silicon-based aerogel composite material after drying under a specific high temperature environment in order to allow the polymer chains covered on the network skeleton structure of the silicon-based aerogel to perform a cross-linking reaction. During such cross-linking reaction, cross-linking reaction takes place between the polymer chains covered onto the silicon-based aerogel network skeleton and between the polymer chains and silicon-based aerogel molecules in order to bond with each other. Accordingly, under such high temperature environment, a porous, lightweight and low-k dielectric polymer/silicon-based aerogel composite material can be obtained after the cross-linking reaction. Please refer to FIG. 5 and FIG. 6, showing a normal appearance and a microstructure of a cross section of the low-k dielectric polyimide/silicon-based aerogel composite board prepared. From the images, it can be seen that the polymers covered onto the network structure of the aerogel particles inside the low-k dielectric polyimide/silicon-based aerogel composite board prepared forms a uniform and porous aerogel structure. In general, the structural uniformity, contraction rate and strength of the polymer/silicon-based aerogel composite material can be adjusted and controlled based on the following factors: content of the alkoxysilane compound or hydrophobically modified alkoxysilane compound, total solvent content, hydrolysis condition, contraction speed, content of surfactant, aging speed, drying speed, concentration of dilute polymer solution, uniformity of polymer infiltration and cross-linking level of polymer chains.

Figure 7:
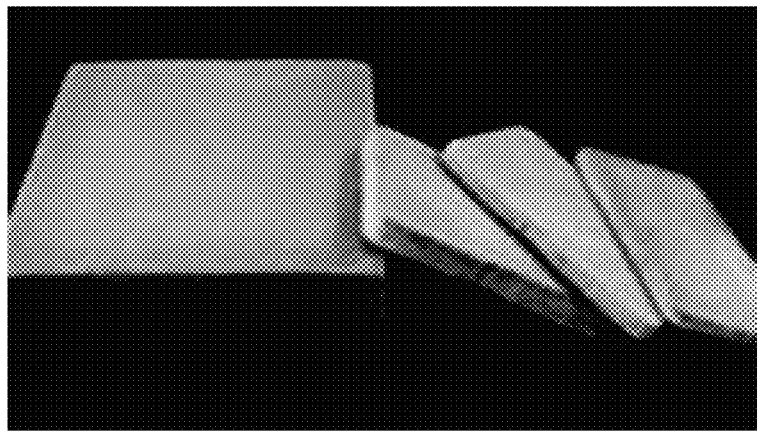
FIG. 7 is a photo image showing the appearance of a low-k dielectric epoxy/silicon-based aerogel composite board prepared according to the method of the present invention.
Figure 8:
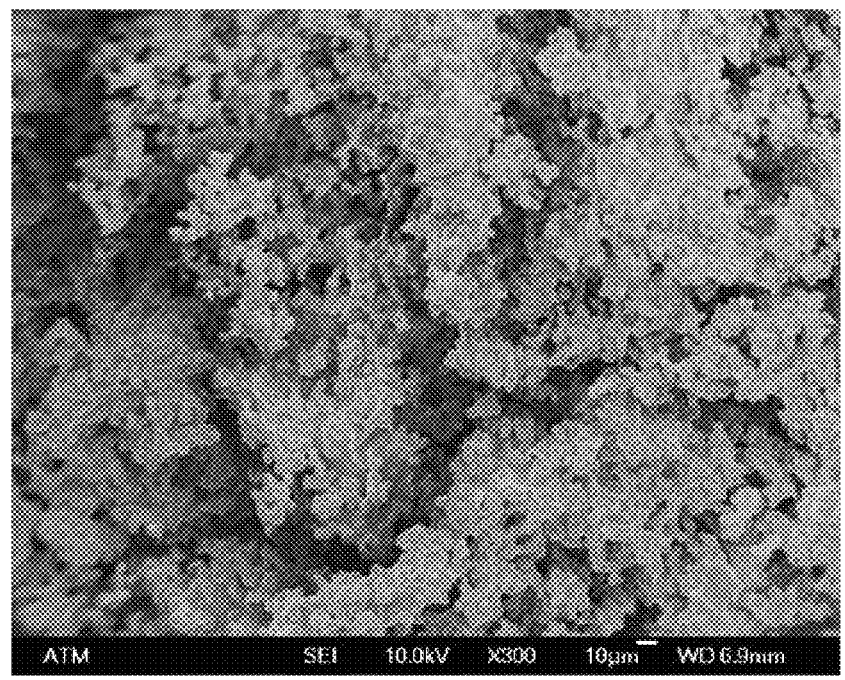
FIG. 8 is a photo image taken from a scanning electron microscope showing a low-k dielectric epoxy/silicon-based aerogel composite board prepared according to the method of the present invention.

Please refer to FIG. 7 and FIG. 8, showing a normal appearance and a microstructure of a cross section of a low-k dielectric epoxy/silicon-based aerogel composite board prepared according to the method of the present invention. The images show that the polymers covered onto the network structure of the aerogel particles inside the low-k dielectric epoxy/silicon-based aerogel composite board prepared forms a uniform and porous aerogel structure.

Please refer to Table 1 below, showing the basic property of a low-k dielectric silicon-based aerogel board, a low-k dielectric polyimide/silicon-based aerogel composite board and a low-k dielectric epoxy/silicon-based aerogel composite board prepared according to the method of the present invention. From the table, it can be understood that the density of the low-k dielectric silicon-based aerogel board prepared according to the method of the present invention decreases from 0.178 g/cm$^3$ to 0.123 g/cm$^3$ along with the increase of the content of the hydrophobically modified alkoxysilane compound in the mixture of the alkoxysilane compound and the hydrophobically modified alkoxysilane compound. In addition, when the frequency of 10 GHz is used for testing, the dielectric constant decreases gradually from 1.526 to 1.276 along with the increase of the content of the hydrophobically modified alkoxysilane compound in the mixture of the alkoxysilane compound and the hydrophobically modified alkoxysilane compound. Furthermore, from the table, it can be understood that the density of the low-k dielectric polyimide/silicon-based aerogel composite board prepared increases from approximately 0.178 g/cm$^3$ to 0.456 g/cm$^3$ along with the increase of the content of polyimide. Moreover, when the frequency of 10 GHz is used for testing, the dielectric constant increases gradually from approximately 1.526 to 1.987 along with the increase of the content of polyimide. Finally, from the table, it can be understood that the density of the low-k dielectric epoxy/silicon-based aerogel composite board prepared increases from approximately 0.178 g/cm$^3$ to 0.461 g/cm$^3$ along with the increase of the content of epoxy. In addition, when the frequency of 10 GHz is used for testing, the dielectric constant increases gradually from approximately 1.526 to 1.821 along with the increase of the content of epoxy. The above indicates that both the low-k dielectric silicon-based aerogel board and the low-k dielectric polymer silicon-based aerogel composite board prepared according to the method of the present invention have excellent dielectric property.

TABLE 1

| Product type | Product code | The hydrophobically modified alkoxysilane compound content in the mixture of alkoxysilane compound and hydrophobically modified alkoxysilane compound (%) | The polymer content in the composite board (%) | Density (g/cm$^3$) | Dk value | Df value |
|---|---|---|---|---|---|---|
| Low-k dielectric silicon-based aerogel board | Si-Aero-1:1.05 | 50 | — | 0.178 | 1.526 | 0.0142 |
| | Si-Aero-1:1.02 | 70 | — | 0.143 | 1.349 | 0.0145 |
| | Si-Aero-1:0.98 | 80 | — | 0.123 | 1.276 | 0.0052 |
| Low-k dielectric epoxy/silicon-based aerogel composite board | EP-Si-Aero-0.98-30 | — | 30 | 0.461 | 1.821 | 0.0242 |
| | EP-Si-Aero-0.98-20 | — | 20 | 0.317 | 1.736 | 0.0197 |
| | EP-Si-Aero-0.98-10 | — | 10 | 0.233 | 1.672 | 0.0127 |
| Low-k dielectric polyimide/silicon-based aerogel composite board | PI-Si-Aero-0.98-30 | — | 30 | 0.456 | 1.987 | 0.0432 |
| | PI-Si-Aero-0.98-20 | — | 20 | 0.329 | 1.784 | 0.0369 |
| | PI-Si-Aero-0.98-10 | — | 10 | 0.276 | 1.643 | 0.0232 |

According to the method of the present invention, alkoxysilane compounds are mixed first, and the sol-gel process technique is then used to prepare an inorganic aerogel material under normal pressure, wherein the inorganic aerogel material refers to a silicon-based aerogel in principle, and its porosity is higher than 70% and its density is approximately between 0.12 g/cm$^3$ and 0.18 g/cm$^3$. In addition, the dielectric property of this product decreases along with the increase of the porosity, wherein the dielectric constant is between 1.28 and 1.35, and the dielectric loss is between 0.0052 and 0.014; therefore, this product has the properties of low dielectric constant and low dielectric loss. Accordingly, relevant products can be used as a dielectric layer in future 5G high-frequency circuits or an insulation layer in high-frequency devices. Subsequently, the inorganic aerogel material can be directly impregnated into thermal setting polymer of polyimide or epoxy or other liquid crystal polymer solutions (poly semi-aromatic liquid crystal polymer and poly aromatic liquid crystal polymer), following which the material is dried under a high temperature environment and is cross-linked or cured to form an organic/inorganic aerogel composite material having a porosity higher than 60%, density of approximately 0.12 g/cm$^3$ to 0.45 g/cm$^3$ (preferably to be 0.2 g/cm$^3$ to 0.45 g/cm$^3$), and its dielectric constant is approximately 1.48 to 1.85 and the dielectric loss is 0.0162 to 0.0239. Accordingly, the aerogel composite material has the properties of low dielectric constant and low dielectric loss. According to the method of the present invention, an inorganic aerogel of high porosity and low dielectric property can be prepared swiftly under normal pressure, and an organic/inorganic composite aerogel can be further manufactured. The method of the present invention does not require the time-consuming process of solvent substitution and does not require the use of supercritical drying equipment; therefore, the overall process is simple, fast and of low cost. The use of the polyimide with polymers covered thereon indicates a significant increase of the strength. Furthermore, the low-k dielectric product according to the method of the present invention can be applied to a dielectric layer in a high frequency circuit or an insulation layer in a semiconductor device. Moreover, such product can also be applied to microwave circuit in 5G communication circuit and low-k dielectric material related applications.

In view of the descriptions of the aforementioned embodiments, the manufacturing, application and technical effects of the present invention can be sufficiently understood. However, it shall be noted that the aforementioned embodiments refer to the preferred embodiments of the present invention only such that they shall not be used to limit the scope of the present invention, i.e. All simple equivalent changes and modifications made based on the claims and the content of the description of the present invention shall be considered to be within the scope of the present invention.

What is claimed is:

1. A preparation method for a low-k dielectric organic/inorganic aerogel composite material, comprising:
   mixing step:
   mixing an alkoxysilane compound or a hydrophobically modified alkoxysilane compound with an organic mixed solvent to form a mixed solution;
   hydrolysis step: adding an acid catalyst into the mixed solution in order to perform a hydrolysis reaction;
   condensation step: adding a basic catalyst into the mixed solution after the hydrolysis reaction in order to perform a condensation reaction, and also adding a surfactant during the condensation reaction process;
   aging step: performing aging of an aerogel board formed via the condensation step in order to promote an aerogel structure to condense further and to achieve a aerogel board structure;
   drying step: after gelatinization in the condensation step and stabilization of the aerogel board structure, performing drying under an environment of constant pressure in order to obtain a low-k dielectric silicon-based aerogel board having a uniform structure;
   impregnating polymer solution step: impregnating the low-k dielectric silicon-based aerogel board into a dilute polymer solution in order to allow polymer chains to infiltrate into an internal of the low-k dielectric silicon-based aerogel board uniformly, thereby forming a wet polymer/silicon-based composite material, wherein the polymer chains are configured to be covered onto a network skeleton structure of the low-k dielectric silicon-based aerogel board;
   phase separation and drying step: placing the wet polymer/silicon-based composite material in order to allow a solvent in the dilute polymer solution to vaporize, thereby performing a liquid-solid phase separation on polymers inside the wet polymer/silicon-based composite material in order to further allow the polymer chains to cover onto the network skeleton structure of the low-k dielectric silicon-based aerogel board and to be dried gradually, and forming a polymer/silicon-based composite material after drying; and
   cross-linking and curing step: placing the polymer/silicon-based composite material after drying in order to allow the polymer chains covered onto the network skeleton structure of the low-k dielectric silicon-based aerogel board to perform a cross-linking reaction, and chemical reaction bonding occurred among the polymer chains and occurred between the polymer chains and silicon-based aerogel molecules of the low-k dielectric silicon-based aerogel board during the cross-linking reaction, thereby obtaining a porous and low-k dielectric polymer/silicon-based aerogel composite material after the cross-linking reaction.

2. The preparation method according to claim 1, wherein the alkoxysilane compound is tetramethoxysilane (TMOS) or tetraethoxysilane (TEOS), and the hydrophobically modified alkoxysilane compound is methyltrimethoxysilane (MTMS) or methyltriethoxysilane (MTES); a mole ratio between the alkoxysilane compound and the hydrophobically modified alkoxysilane compound is between 0:100 and 35:65.

3. The preparation method according to claim 2, wherein the dilute polymer solution comprises a mixture of a thermal setting polymer, a thermal plastic polymer and a liquid crystal polymer.

4. The preparation method according to claim 3, wherein the thermal setting polymer is selected from one of the following or a mixture thereof: epoxy, polyimide, phenolic resin, and melamine resin; the thermal plastic polymer is selected from one of the following or a mixture thereof: polyethylene, polypropylene, polytetrafluoroethylene, polycarbonate, polyamide, polyesteramide and polyethylene terephthalate; the liquid crystal polymer is selected from one of the following or a mixture thereof: poly semi-aromatic liquid crystal polymer and poly aromatic liquid crystal polymer.

5. The preparation method according to claim 1, wherein the weight ratio between the amount of the surfactant and the amount of the mixture of the alkoxysilane and the hydrophobically modified alkoxysilane compound is between 1:100 and 1:3000.

6. The preparation method according to claim 5, wherein in the dilute polymer solution comprises a mixture of a thermal setting polymer, a thermal plastic polymer and a liquid crystal polymer.

7. The preparation method according to claim 6, wherein the thermal setting polymer is selected from one of the following or a mixture thereof: epoxy, polyimide, phenolic resin, and melamine resin; the thermal plastic polymer is selected from one of the following or a mixture thereof: polyethylene, polypropylene, polytetrafluoroethylene, polycarbonate, polyamide, polyesteramide and polyethylene terephthalate; the liquid crystal polymer is selected from one of the following or a mixture thereof: poly semi-aromatic liquid crystal polymer and poly aromatic liquid crystal polymer.

8. The preparation method according to claim 1, wherein a polymer concentration of the dilute polymer solution used in the impregnating polymer solution step is between 0.01 wt % and 60 wt %, thereby allowing the polymer chains to uniformly infiltrate into the internal of the low-k dielectric silicon-based aerogel board in order to form the wet polymer/silicon-based composite material.

9. The preparation method according to claim 8, wherein in the dilute polymer solution comprises a mixture of a thermal setting polymer, a thermal plastic polymer and a liquid crystal polymer.

10. The preparation method according to claim 9, wherein the thermal setting polymer is selected from one of the following or a mixture thereof: epoxy, polyimide, phenolic resin, and melamine resin; the thermal plastic polymer is selected from one of the following or a mixture thereof: polyethylene, polypropylene, polytetrafluoroethylene, polycarbonate, polyamide, polyesteramide and polyethylene terephthalate; the liquid crystal polymer is selected from one of the following or a mixture thereof: poly semi-aromatic liquid crystal polymer and poly aromatic liquid crystal polymer.

11. The preparation method according to claim 1, wherein the dilute polymer solution comprises a mixture of a thermal setting polymer, a thermal plastic polymer and a liquid crystal polymer.

12. The preparation method according to claim 11, wherein the thermal setting polymer is selected from one of the following or a mixture thereof: epoxy, polyimide, phenolic resin, and melamine resin; the thermal plastic polymer is selected from one of the following or a mixture thereof: polyethylene, polypropylene, polytetrafluoroethylene, polycarbonate, polyamide, polyesteramide and polyethylene terephthalate; the liquid crystal polymer is selected from one of the following or a mixture thereof: poly semi-aromatic liquid crystal polymer and poly aromatic liquid crystal polymer.

13. The preparation method according to claim 1, wherein a structural uniformity, a contraction ratio and a strength of the polymer/silicon-based aerogel composite material after drying are adjusted and controlled based on the following factors during preparation: a content of the alkoxysilane compound or the hydrophobically modified alkoxysilane compound, a total solvent content, a hydrolysis criterion, a condensation speed, a content of the surfactant, an aging speed, a drying speed, a concentration of the dilute polymer solution, an infiltration uniformity of the polymers and a cross-linking level of the polymer chains.

14. The preparation method according to claim 1, wherein a porosity of the porous and low-k dielectric polymer/silicon-based aerogel composite material is higher than 60%, a density thereof is between 0.12 and 0.45 g/cm$^3$, and a dielectric property thereof decreases along with an increase of the porosity; wherein a dielectric constant thereof is between 1.23 and 1.987, and a dielectric loss thereof is between 0.0052 and 0.023; the porous and low-k dielectric polymer/silicon-based aerogel composite material is used for a dielectric layer in a high-frequency circuit, an insulation layer in a semiconductor device or a microwave circuit in a communication integrated circuit.

* * * * *